US012811604B2

(12) United States Patent
Ryu et al.

(10) Patent No.: US 12,811,604 B2
(45) Date of Patent: Nov. 24, 2026

(54) SIGMA-DELTA MODULATOR, ADC USED TO READ INFORMATION OF RESISTIVE MEMORY USING THE SIGMA-DELTA MODULATOR, AND DEEP LEARNING NEURAL NETWORK COMPUTING SYSTEM INCLUDING THE ADC

(71) Applicants: SK hynix Inc., Icheon-si (KR); KOREA ADVANCED INSTITUTE OF SCIENCE AND TECHNOLOGY, Daejeon (KR)

(72) Inventors: Seung Tak Ryu, Daejeon (KR); Chang Yeop Lee, Daejeon (KR); Jun Ho Cheon, Icheon-si (KR); Woo Yeong Cho, Icheon-si (KR); Geon Ko, Icheon-si (KR)

(73) Assignees: SK hynix Inc., Icheon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 527 days.

(21) Appl. No.: 18/505,787

(22) Filed: Nov. 9, 2023

(65) Prior Publication Data

US 2024/0340023 A1 Oct. 10, 2024

(30) Foreign Application Priority Data

Apr. 7, 2023 (KR) ........................ 10-2023-0046030

(51) Int. Cl.
*H03M 3/00* (2006.01)
*G06N 3/08* (2023.01)
(Continued)

(52) U.S. Cl.
CPC .............. *H03M 3/322* (2013.01); *G06N 3/08* (2013.01); *G11C 11/54* (2013.01);
(Continued)

(58) Field of Classification Search
USPC .......................................................... 329/363
See application file for complete search history.

(56) References Cited

U.S. PATENT DOCUMENTS 5,729,230 A * 3/1998 Jensen .................. H03M 3/396 341/118
6,816,097 B2 * 11/2004 Brooks ................. H03M 3/502 341/143
(Continued)

FOREIGN PATENT DOCUMENTS

KR 10-1463034 B1 11/2014
KR 10-2021-0000987 A 1/2021

*Primary Examiner* — Joseph Chang

(57) ABSTRACT

Disclosed are a sigma-delta modulator that directly converts a current signal into digital data, an ADC utilizing the sigma-delta modulator, and a neural network computing system utilizing the ADC. The sigma-delta modulator includes: a delta circuit to generate a differential current between an analog current signal output from a resistive memory and a first current included in the analog current signal, the first current having an amount of current determined by a digital modulation signal; an integration circuit to generate an integration current by integrating the differential current; and a quantization circuit to generate the digital modulation signal corresponding to the integration current. The sigma-delta modulator can minimize the generation of noise by using no capacitor that performs a function by a switch, and can increase a signal processing speed for conversion by allowing the signal processing speed to be determined by a signal processing speed of one element.

8 Claims, 6 Drawing Sheets

110

(51) Int. Cl.
*G11C 11/54* (2006.01)
*G11C 13/00* (2006.01)

(52) U.S. Cl.
CPC ......... *G11C 13/0038* (2013.01); *H03M 3/422* (2013.01); *H03M 3/458* (2013.01)

(56) References Cited

U.S. PATENT DOCUMENTS

| | | | | |
|---|---|---|---|---|
| 2008/0310236 | A1 | 12/2008 | Baker | |
| 2016/0380646 | A1* | 12/2016 | Kauffman ........... | H03M 1/0607 341/118 |
| 2017/0330616 | A1 | 11/2017 | Papandreou et al. | |
| 2020/0166606 | A1* | 5/2020 | Oshima ................... | G01S 13/34 |
| 2020/0381027 | A1 | 12/2020 | Horng et al. | |

* cited by examiner

SIGMA-DELTA MODULATOR, ADC USED TO READ INFORMATION OF RESISTIVE MEMORY USING THE SIGMA-DELTA MODULATOR, AND DEEP LEARNING NEURAL NETWORK COMPUTING SYSTEM INCLUDING THE ADC

CROSS-REFERENCE TO RELATED APPLICATION

This application claims priority under 35 U.S.C. § 119 to Korean Patent Application No. 10-2023-0046030 filed on Apr. 7, 2023, which is incorporated herein by reference in its entirety.

BACKGROUND

1. Field

Exemplary embodiments relate to a sigma-delta modulator, and more particularly, to a sigma-delta modulator that directly converts a current signal into digital data, can minimize the generation of noise by using no capacitor that performs a function by a switch, and can increase a signal processing speed for conversion by allowing the signal processing speed to be determined by a signal processing speed of one element, an analog-to-digital converter (ADC) used to read information of a resistive memory using the sigma-delta modulator, and a deep learning neural network computing system including the ADC used to read the information of the resistive memory.

2. Discussion of the Related Art

Recently, multiply-accumulate (MAC), which performs a deep neural network operation by using a resistive memory array including a plurality of resistive memory cells, requires a high-speed analog-to-digital converter (ADC) that consumes low power.

As a structure suitable for a high-speed ADC that consumes low power, a flash ADC, a single slope ADC, a successive approximation register (SAR) ADC, a capacitor digital analog converter (CDAC) using a charge sharing method, an ADC operating in a voltage domain such as a structure combined with the flash ADC, or an ADC operating as a current comparator with a reference current has been proposed.

A conventional ADC includes a configuration of converting current into voltage and processing a signal in the voltage domain, has a disadvantage in that power consumption increases in an integration process when an integrator is used for conversion, and has a disadvantage in that circuit performance is reduced due to noise caused by jitter, clock feed-through, and charge injection even when a structure using a switch and a capacitor is applied.

An ADC operating in a time domain has low power consumption and high-speed operation, but a resistive memory used with the ADC operating the time domain is vulnerable to variations in PVT (pressure-volume-temperature).

Particularly, when each ADC needs to operate simultaneously in a plurality of channels, the larger an area occupied by the ADC, the larger an area required for an entire system. Accordingly, an ADC, which has low power consumption and high-speed operation and occupies a minimum area, is required.

SUMMARY

Various embodiments are directed to providing a sigma-delta modulator that directly converts a current signal into digital data, can minimize the generation of noise by using no capacitor that performs a function by a switch, and can increase a signal processing speed for conversion by allowing the signal processing speed to be determined by a signal processing speed of one element.

Various embodiments are directed to providing an ADC used to read information of a resistive memory utilizing the sigma-delta modulator.

Various embodiments are directed to providing a deep learning neural network computing system utilizing the ADC used to read the information of the resistive memory.

Technical problems to be achieved in the present disclosure are not limited to the aforementioned technical problems and the other unmentioned technical problems will be clearly understood by those skilled in the art from the following description.

A sigma-delta modulator according to the present disclosure includes a delta circuit, an integration circuit, and a quantization circuit. The delta circuit generates a differential current between an analog current signal output from a resistive memory and a first current included in the analog current signal. The first current has an amount of current determined by a digital modulation signal. The integration circuit generates an integration current by integrating the differential current. The quantization circuit generates the digital modulation signal corresponding to the integration current.

An ADC used to read information of a resistive memory according to the present disclosure includes a sigma-delta modulator. The sigma-delta modulator includes a delta circuit configured to generate a differential current between an analog current signal output from the resistive memory and a first current included in the analog current signal, the first current having an amount of current determined by a digital modulation signal, an integration circuit including a first integrator configured to primarily integrate the differential current using a first capacitor and a second integrator configured to generate an integration current by secondarily integrating the differential current using a transconductance amplifier, a resistor, and a second capacitor, and a quantization circuit configured to generate the digital modulation signal corresponding to the integration current.

A deep learning neural network computing system according to the present disclosure includes a crossbar array and an analog-to-digital conversion block. The crossbar array includes a plurality of resistive memory cells arranged in a matrix form. Each of the plurality of resistive memory cells includes a resistive element. The analog-to-digital conversion block includes an ADC configured to generate digital data corresponding to an analog current signal read from resistive elements of the crossbar array connected to each column line. The ADC includes a sigma-delta modulator.

The sigma-delta modulator includes a delta circuit, an integration circuit, and a quantization circuit. The delta circuit is configured to generate a differential current between the analog current signal and a first current included in the analog current signal. The first current has an amount of current determined by a digital modulation signal corresponding to the digital data. The integration circuit includes a first integrator configured to primarily integrate the differential current using a first capacitor and a second integrator configured to generate an integration current by secondarily integrating the differential current using a transconductance amplifier, a resistor, a second capacitor, and a variable current source operating in response to the digital modulation signal. The quantization circuit is configured to generate the digital modulation signal corresponding to the integration current.

Since the sigma-delta modulator according to the present disclosure directly processes a current signal without converting it into a voltage signal, power consumption thereof is reduced compared to a method of converting a current signal into a voltage signal and processing the voltage signal. Furthermore, by not using a switch and a capacitor in combination, effects due to noise caused by jitter, clock feed-through, and charge injection can be minimized. Particularly, by using the transconductance amplifier having an open loop structure, there is an advantage of maximizing a gain band-width product (GBWP) of the amplifier.

Effects achievable in the disclosure are not limited to the aforementioned effects and the other unmentioned effects will be clearly understood by those skilled in the art from the following description.

DETAILED DESCRIPTION

Figure 1:
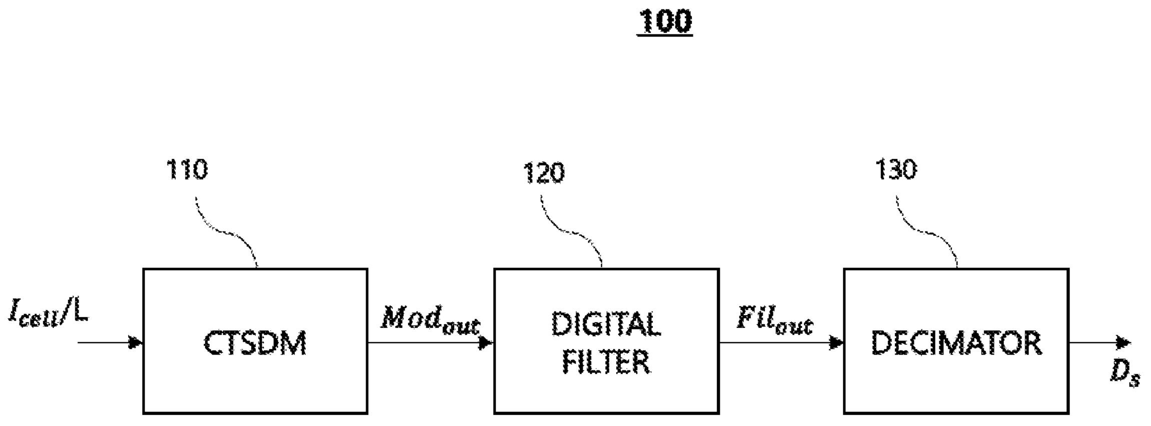
FIG. 1 illustrates an ADC used to read information of a resistive memory according to an embodiment of the present disclosure.

In order to fully understand the present disclosure, advantages in operation of the present disclosure, and objects achieved by carrying out the present disclosure, the accompanying drawings for explaining exemplary examples of the present disclosure and the contents described with reference to the accompanying drawings need to be referred to.

Hereinafter, preferred embodiments of the present disclosure are described in detail with reference to the accompanying drawings. The same reference numerals among the reference numerals in each drawing indicate the same members.

FIG. 1 an ADC 100 used to read information of a resistive memory according to an embodiment of the present disclosure.

Referring to FIG. 1, the ADC 100 includes a continuous-time sigma-delta modulator (CTSDM) 110, a digital filter (DIGITAL FILTER) 120, and a decimator (DECIMATOR) 130.

The CTSDM 110 converts an analog current signal $I_{cell}/L$ output from the resistive memory into a digital modulation signal $Mod_{out}$. The DIGITAL FILTER 120 removes noise, generated by the CTSDM 110, from the digital modulation signal $Mod_{out}$, filters a signal component of interest $Fil_{out}$ from the digital modulation signal $Mod_{out}$, and outputs the signal component of interest $Fil_{out}$. The CTSDM 110 is generally implemented as a low pass filter. The DECIMATOR 130 performs a function of adjusting a signal oversampled by the CTSDM 110 to an original frequency band and outputs a digital data signal Ds.

In the above, a variable L is a natural number and the analog current signal $I_{cell}/L$ will be described in detail below.

Figure 2:
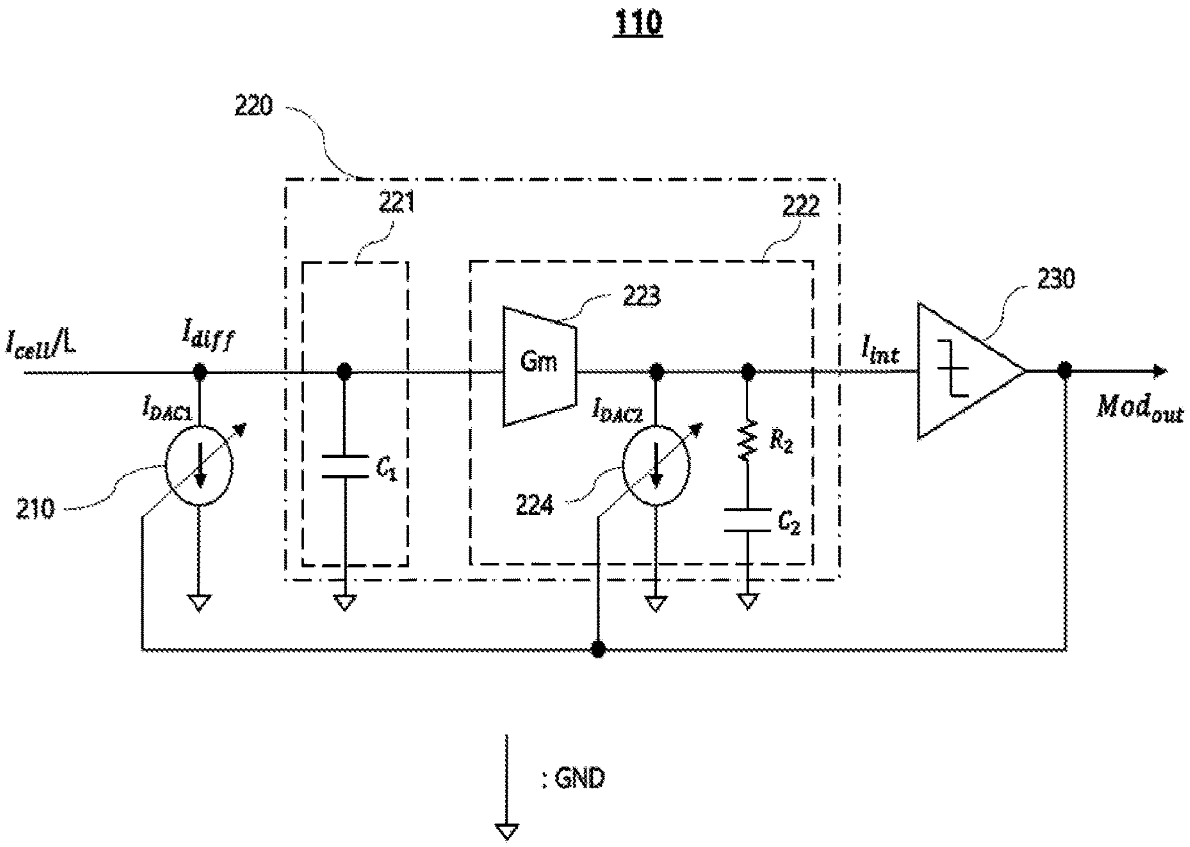
FIG. 2 describes a sigma-delta modulator illustrated in FIG. 1 according to an embodiment of the present disclosure.

FIG. 2 describes the CTSDM 110 illustrated in FIG. 1 according to an embodiment.

Referring to FIG. 2, the CTSDM 110 includes a delta circuit 210, an integration circuit 220, and a quantization circuit 230, and converts the analog current signal $I_{cell}/L$ output from the resistive memory into the digital modulation signal $Mod_{out}$.

The delta circuit 210 sinks, to a ground terminal GND, a first current $I_{DAC1}$ determined by the modulation signal $Mod_{out}$ among currents included in the analog current signal $I_{cell}/L$ output from the resistive memory. The delta circuit 210 may be implemented as a first variable current source 210 that sinks the first current $I_{DAC1}$ to the ground terminal GND in response to the modulation signal $Mod_{out}$. Accordingly, a differential current $I_{diff}$ $(=I_{cell}/L-I_{DAC1})$ between the current signal $I_{cell}/L$ applied to the delta circuit 210 and the first current $I_{DAC1}$ is applied to the integration circuit 220.

The integration circuit 220 includes a primary integration circuit 221 and a secondary integration circuit 222, and generates an integration current $I_{int}$ by integrating the differential current $I_{diff}$ between the current signal $I_{cell}/L$ and the first current $I_{DAC1}$ in two steps.

The primary integration circuit 221 includes a first capacitor $C_1$ that primarily accumulates the differential current $I_{diff}$. Since the primary integration circuit 221 directly accumulates the differential current $I_{diff}$ that is proportional to a wire resistance value of a path to the first capacitor $C_1$ and the capacitance of the first capacitor $C_1$, the non-linearity of integration can be reduced.

The secondary integration circuit 222 includes a transconductance amplifier (Gm) 223, a second variable current source 224, a resistor $R_2$, and a second capacitor $C_2$, and amplifies the differential current $I_{diff}$ and then secondarily accumulates the amplified differential current to generate the integration current $I_{int}$.

The Gm 223 generates the integration current $I_{int}$ by amplifying the differential current $I_{diff}$ in combination with the second variable current source 224, the resistor $R_2$, and the second capacitor $C_2$ that are connected to an output terminal of the Gm 223.

The second variable current source 224 sinks, to the ground terminal GND, a second current $I_{DAC2}$, which is determined by the modulation signal $Mod_{out}$ among currents included in the differential current $I_{diff}$. Accordingly, the integration current $I_{int}$, which is a differential current $I_{diff}-I_{DAC2}$ between the differential current $I_{diff}$ input to the secondary integration circuit 222 and the second current $I_{DAC2}$, flows through the resistor $R_2$ and the second capacitor $C_2$ that are connected in series between the output terminal of the Gm 223 and the ground terminal GND. As a result, a voltage determined by the sum of the integration current $I_{int}$ and the impedance of the resistor $R_2$ and the second capacitor $C_2$ is applied to the quantization circuit 230.

The resistor $R_2$ includes one terminal connected to the output terminal of the Gm 223. The second capacitor $C_2$ includes one terminal connected to the other terminal of the resistor $R_2$ and the other terminal connected to the ground terminal GND.

The quantization circuit 230 outputs the modulation signal $Mod_{out}$ having a quantum value corresponding to the voltage determined by the sum of the integration current $I_{int}$ and the impedance of the resistor $R_2$ and the second capacitor $C_2$.

The quantum value of the modulation signal $Mod_{out}$ includes digital data. That is, the modulation signal $Mod_{out}$ includes digital data corresponding to the voltage determined by the sum of the integration current $I_{int}$ and the impedance of the resistor $R_2$ and the second capacitor $C_2$.

The CTSDM 110 illustrated in FIG. 2 generates the digital modulation signal $Mod_{out}$ corresponding to the current signal $I_{cell}/L$ by using differences between the analog current signal $I_{cell}/L$ output from the resistive memory and the two differential currents $I_{diff}$ and $I_{int}$ corresponding to the modulation signal $Mod_{out}$.

Since the primary integration circuit 221 directly integrates a current, other than a voltage, in proportion to the wire resistance value of the path to the first capacitor $C_1$ and the capacitance of the first capacitor $C_1$, the non-linearity of integration can be reduced.

Since the secondary integration circuit 222 has a small number of elements, when the secondary integration circuit 222 is implemented with a semiconductor integrated circuit, an area occupied by the elements of the secondary integration circuit 222 is small and the signal processing speed of the secondary integration circuit 222 is determined by the signal processing speed of one Gm 223, so that the overall processing speed of the CTSDM 110 becomes high.

The advantages of the CTSDM 110 illustrated in FIG. 2 are summarized as follows.

Since the CTSDM 110 illustrated in FIG. 2 directly processes a current signal without converting it into a voltage signal, it can reduce power consumption compared to a conventional method of converting a current signal into a voltage signal and processing the voltage signal. Furthermore, by not using a switch and a capacitor in combination, effects due to noise caused by jitter, clock feed-through, and charge injection can be minimized.

Particularly, by using a transconductance amplifier, e.g., the Gm 223, having an open loop structure, it is possible to maximize a gain band-width product (GBWP) of the amplifier.

In relation to types and the number of elements of the CTSDM 110 illustrated in FIG. 2, when the CTSDM 110 is implemented with a semiconductor integrated circuit, it can be sufficiently predicted that an area occupied by the elements of the CTSDM 110 is incomparably smaller than an area occupied by a conventional sigma-delta modulator.

As described above, the ADC 100 including the CTSDM 110 illustrated in FIG. 2 can also be used for a deep learning neural network computing system as will be described below.

Figure 3:
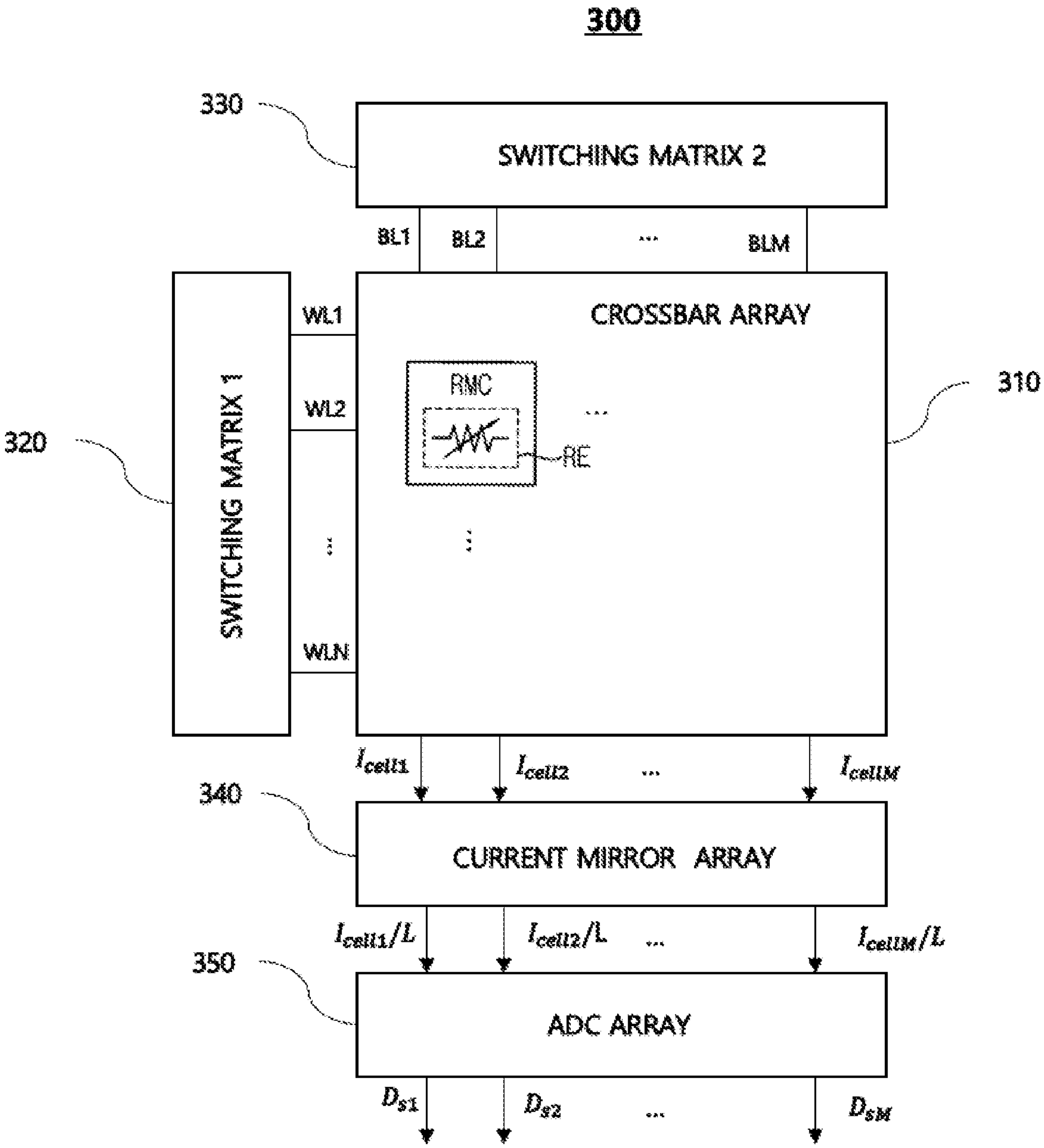
FIG. 3 illustrates a deep learning neural network computing system using an ADC according to an embodiment of the present disclosure.

FIG. 3 illustrates a deep learning neural network computing system 300 using the ADC 100 according to an embodiment of the present disclosure.

Referring to FIG. 3, the deep learning neural network computing system 300 includes a crossbar array (CROSSBAR ARRAY) 310, a first switching matrix (SWITCHING MATRIX1) 320, a second switching matrix (SWITCHING MATRIX2 330), a current value downscale block (CURRENT MIRROR ARRAY) 340, and an analog-to-digital conversion block (ADC ARRAY) 350.

The CROSSBAR ARRAY 310 includes a plurality of resistive memory cells RMC arranged in a matrix form, each of the plurality of resistive memory cells RMC including a resistive element RE.

Figure 4:
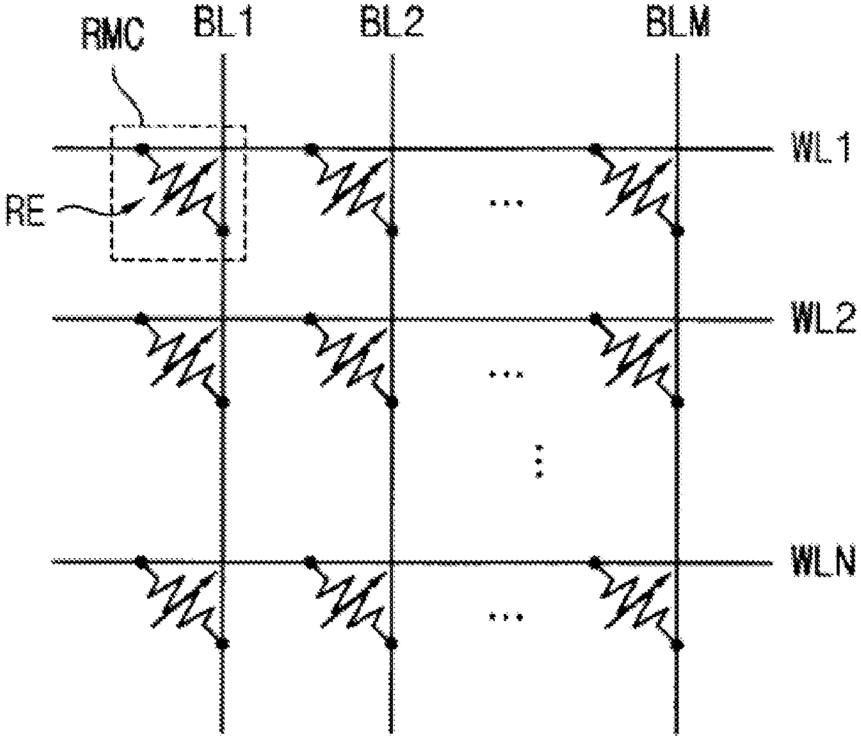
FIG. 4 describes an internal configuration of a crossbar array illustrated in FIG. 3 according to an embodiment of the present disclosure.

FIG. 4 illustrates an internal configuration of the CROSSBAR ARRAY 310 illustrated in FIG. 3.

Referring to FIG. 4, each of the plurality of resistive memory cells RMC receives a corresponding one of a plurality of word line control signals WL1 to WLN (N is a natural number) and a corresponding one of a plurality of bit line control signals BL1 to BLM (M is a natural number).

The SWITCHING MATRIX1 320 provides the plurality of word line control signals WL1 to WLN to the CROSSBAR ARRAY 310, and the SWITCHING MATRIX2 330 provides the plurality of bit line control signals BL1 to BLM to the CROSSBAR ARRAY 310.

The CURRENT MIRROR ARRAY 340 may include a current mirror circuit that generates a downscale current $I_{celli}/L$ by reducing (or down-scale), by 1/L (L is a natural number), an amplitude of a current $I_{celli}$ read from resistive elements of the CROSSBAR ARRAY 310 connected to each column line (or each bit line), i being in a range of 1 to M.

Figure 5:
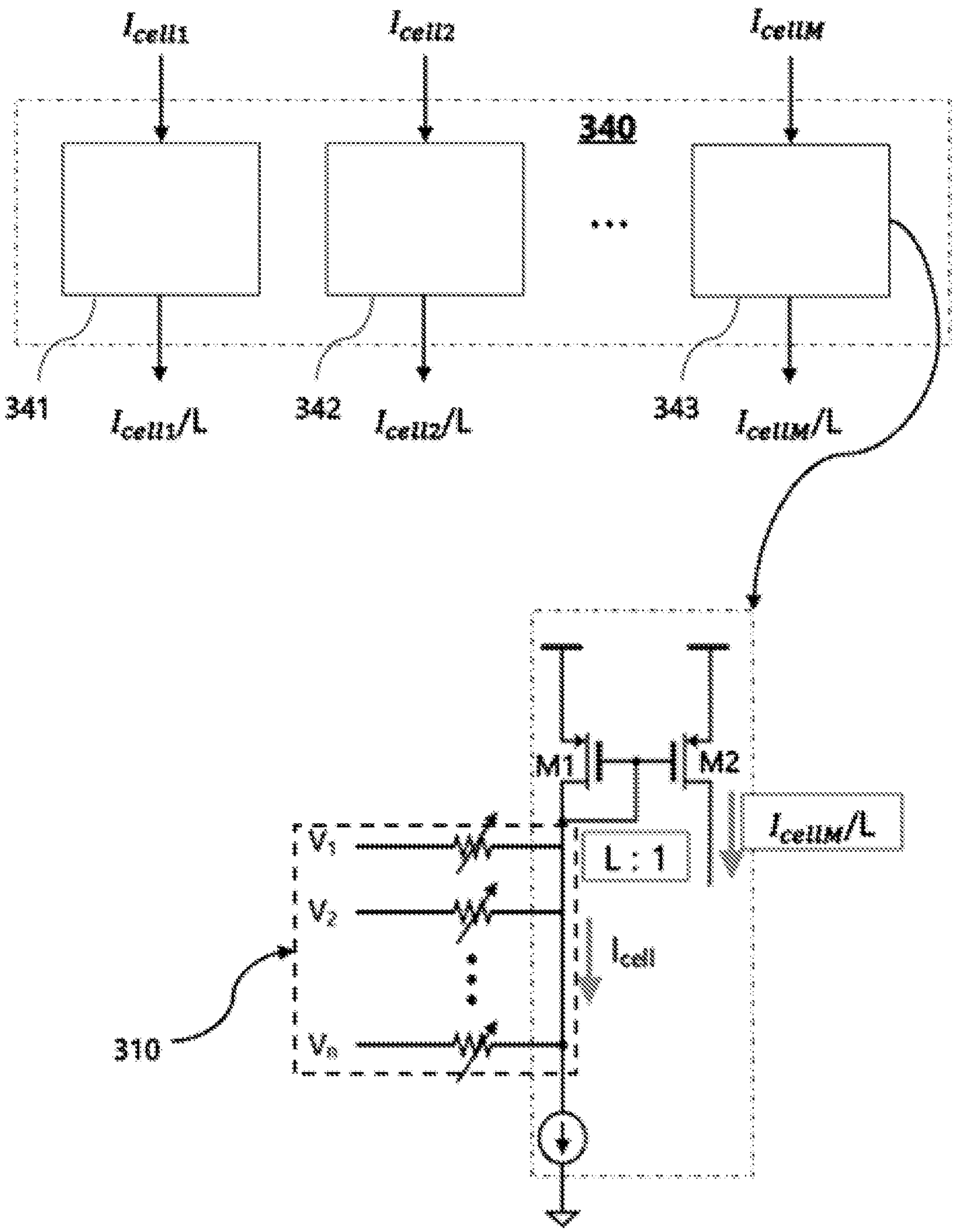
FIG. 5 describes a current value downscale block illustrated in FIG. 3 according to an embodiment of the present disclosure.

FIG. 5 describes the CURRENT MIRROR ARRAY 340 illustrated in FIG. 3 according to an embodiment of the present disclosure.

Referring to FIG. 5, the CURRENT MIRROR ARRAY 340 includes a plurality of current mirror circuits 341 to 343.

In each of the plurality of current mirror circuits 341 to 343, it can be seen that by setting a ratio width/length (W/L) of two transistors M1 and M2 constituting the current mirror circuit to L:1 (L is a natural number), the downscale current $I_{cell}/L$ is generated by reducing (or down-scale), by 1/L, the amplitude of the current $I_{cell}$ read from the resistive elements of the CROSSBAR ARRAY 310 connected to each column line (or bit line).

Referring back to FIG. 3, the ADC ARRAY 350 converts a plurality of analog downscale currents $I_{cell1}/L$ to $I_{cellM}/L$ output from the CURRENT MIRROR ARRAY 340 into corresponding digital data signals $D_{s1}$ to $D_{sM}$, respectively.

Figure 6:
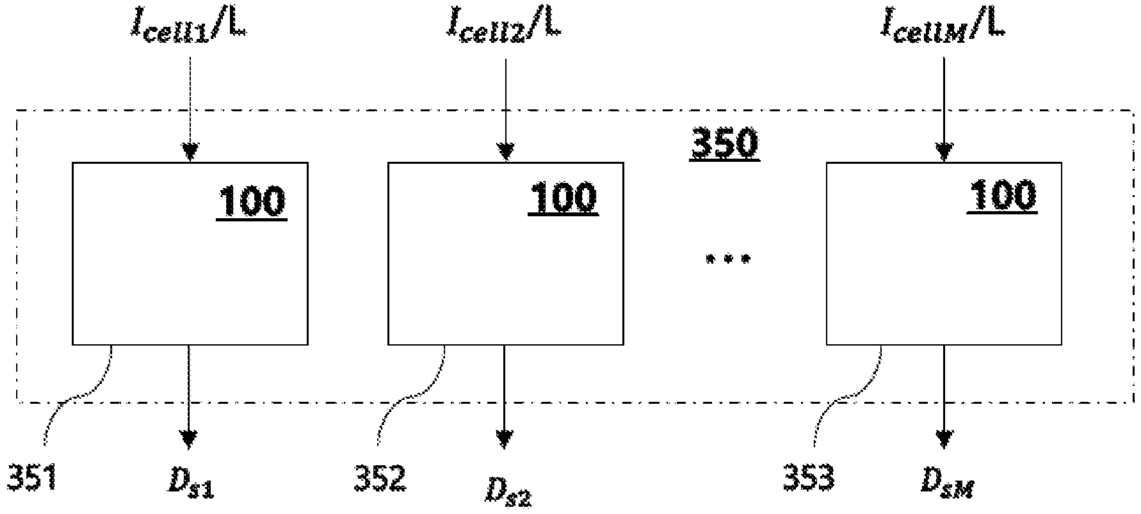
FIG. 6 describes an analog-to-digital conversion block illustrated in FIG. 3 according to an embodiment of the present disclosure.

FIG. 6 describes the ADC ARRAY 350 illustrated in FIG. 3 according to an embodiment of the present disclosure.

As illustrated in FIG. 6, the ADC ARRAY 350 may be implemented using the ADC 100 illustrated in FIG. 1.

The ADC ARRAY 350 includes a plurality of ADCs 351 to 353 each corresponding to the ADC 100. The plurality of ADCs 351 to 353 receive the plurality of analog downscale currents $I_{cell1}/L$ to $I_{cellM}/L$ output from the CURRENT MIRROR ARRAY 340, respectively, and output the plurality of digital data signals $D_{s1}$ to $D_{sM}$, respectively.

The present disclosure described above can be implemented as computer-readable codes on a medium on which a program is recorded. The computer-readable medium includes all types of recording devices in which data that can be read by a computer system are stored. Examples of computer-readable media include a hard disk drive (HDD), a solid state disk (SSD), a silicon disk drive (SDD), a ROM, a RAM, a CD-ROM, a magnetic tape, a floppy disk, and an optical data storage device.

Although the technical spirit of the present disclosure has been described together with the accompanying drawings, this is an illustrative example of a preferred embodiment of the present disclosure, but does not limit the present disclosure. In addition, it is clear that various modifications and imitations can be made by anyone skilled in the art to which the present disclosure belongs without departing from the scope of the technical spirit of the present disclosure.

What is claimed is:

1. A sigma-delta modulator comprising:

a delta circuit configured to generate a differential current between an analog current signal output from a resistive memory and a first current included in the analog current signal, the first current having an amount of current determined by a digital modulation signal;

a first integrator configured to integrate the differential current using a first capacitor;

a second integrator configured to generate an integration current by integrating the differential current using a transconductance amplifier, a resistor, and a second capacitor;

a quantization circuit configured to generate the digital modulation signal corresponding to the integration current.

2. The sigma-delta modulator of claim 1, wherein the delta circuit comprises:

a first variable current source configured to sink an amount of current corresponding to the first current to a ground power supply.

3. The sigma-delta modulator of claim 1, wherein the first capacitor includes one terminal to which the differential current is applied and the other terminal connected to a ground power supply.

4. The sigma-delta modulator of claim 1, wherein the transconductance amplifier receives the differential current through an input terminal thereof and outputs the integration current through an output terminal thereof, the resistor includes one terminal connected to the output terminal of the transconductance amplifier, and the second capacitor includes one terminal connected to the other terminal of the resistor and the other terminal connected to a ground power supply.

5. The sigma-delta modulator of claim 4, wherein the second integrator further comprises:

a second variable current source configured to sink, to the ground power supply, an amount of current corresponding to a second current included in the differential current, the amount of current corresponding to the second current being determined by the digital modulation signal.

6. An analog-to-digital converter (ADC) used to read information of a resistive memory including a sigma-delta modulator, wherein the sigma-delta modulator comprises:

a delta circuit configured to generate a differential current between an analog current signal output from the resistive memory and a first current included in the analog current signal, the first current having an amount of current determined by a digital modulation signal;

an integration circuit including a first integrator configured to primarily integrate the differential current using a first capacitor and a second integrator configured to generate an integration current by secondarily integrating the differential current using a transconductance amplifier, a resistor, and a second capacitor; and a quantization circuit configured to generate the digital modulation signal corresponding to the integration current.

7. The ADC of claim 6, wherein the second integrator further comprises:

a variable current source configured to sink, to a ground power supply, an amount of current corresponding to a second current included in the differential current, the amount of current corresponding to the second current being determined by the digital modulation signal.

8. A deep learning neural network computing system comprising:

a crossbar array including a plurality of resistive memory cells arranged in a matrix form, each of the plurality of resistive memory cells including a resistive element; and an analog-to-digital conversion block including an analog-to-digital converter (ADC) configured to generate digital data corresponding to an analog current signal read from resistive elements of the crossbar array connected to each column line, wherein the ADC includes a sigma-delta modulator, and the sigma-delta modulator comprises:

a delta circuit configured to generate a differential current between the analog current signal and a first current included in the analog current signal, the first current having an amount of current determined by a digital modulation signal corresponding to the digital data;

an integration circuit including a first integrator configured to primarily integrate the differential current using a first capacitor and a second integrator configured to generate an integration current by secondarily integrating the differential current using a transconductance amplifier, a resistor, a second capacitor, and a variable current source operating in response to the digital modulation signal; and a quantization circuit configured to generate the digital modulation signal corresponding to the integration current.

* * * * *